United States Patent
Morris et al.

(10) Patent No.: US 9,997,227 B2
(45) Date of Patent: Jun. 12, 2018

(54) NON-VOLATILE FERROELECTRIC LOGIC WITH GRANULAR POWER-GATING

(71) Applicant: Intel Corporation, Santa Clara, CA (US)

(72) Inventors: Daniel H. Morris, Hillsboro, OR (US); Uygar E. Avci, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 14/975,439

(22) Filed: Dec. 18, 2015

(65) Prior Publication Data
US 2017/0178711 A1    Jun. 22, 2017

(51) Int. Cl.
*G11C 5/14*    (2006.01)
*G11C 11/22*    (2006.01)
*H03K 19/00*    (2006.01)
*H03K 19/18*    (2006.01)

(52) U.S. Cl.
CPC .......... *G11C 11/223* (2013.01); *G11C 11/221* (2013.01); *G11C 11/2297* (2013.01); *H03K 19/0016* (2013.01); *H03K 19/18* (2013.01)

(58) Field of Classification Search
CPC .. G11C 11/223; G11C 11/221; G11C 11/2297
USPC ............................ 365/226, 65, 49.13, 189.09
See application file for complete search history.

(56) References Cited

U.S. PATENT DOCUMENTS

| | | | | |
|---|---|---|---|---|
| 5,923,184 A * | 7/1999 | Ooms | ..................... | H03K 19/08 326/121 |
| 6,233,169 B1 * | 5/2001 | Nishimura | .............. | G11C 11/22 365/145 |
| 6,249,458 B1 * | 6/2001 | Shokouhi | ............... | G11C 16/12 326/80 |
| 6,314,016 B1 * | 11/2001 | Takasu | .................... | G11C 11/22 326/49 |
| 2002/0190784 A1 * | 12/2002 | Watson | ..................... | H03F 1/26 327/560 |
| 2004/0095181 A1 | 5/2004 | Ohtsuka et al. | | |
| 2004/0164778 A1 | 8/2004 | Toyoda et al. | | |
| 2004/0183508 A1 | 9/2004 | Toyoda et al. | | |
| 2004/0196689 A1 | 10/2004 | Ohtsuka et al. | | |
| 2009/0096483 A1 * | 4/2009 | Kuhn | ............... | H03K 19/00315 326/56 |
| 2009/0121744 A1 * | 5/2009 | Kuhn | ........................ | G06F 1/08 326/93 |
| 2010/0309710 A1 | 12/2010 | Evans, Jr. | | |
| 2011/0038201 A1 * | 2/2011 | Takahashi | ............... | G11C 11/22 365/182 |

(Continued)

OTHER PUBLICATIONS

International Search Report & Written Opinion dated Feb. 3, 2017 for PCT Patent Application No. PCT/US2016/058716.

(Continued)

*Primary Examiner* — Vu Le
(74) *Attorney, Agent, or Firm* — Green, Howard & Mughal LLP

(57) ABSTRACT

Described is an apparatus which comprises: a first power domain having a first inverter to be powered by a first switchable positive supply and a first switchable negative supply; and a second power domain having a second inverter including p-type and n-type FE-FETs, the second inverter having an input coupled to an output of the first inverter.

8 Claims, 8 Drawing Sheets

(56) References Cited

U.S. PATENT DOCUMENTS

2014/0112053 A1* 4/2014 Youn ................. G11C 13/0069
365/148
2014/0333378 A1* 11/2014 Karthaus ............... H03F 3/2171
330/251

OTHER PUBLICATIONS

Kimura et al., "Complementary Ferroelectric-Capacitor Logic for Low-Power Logic-in-Memory VLSI," IEEE Journal of Solid-State Circuits, vol. 39, No. 6, pp. 919-926, Jun. 2004.
Sheikholeslami et al., "A Survey of Circuit Innovations in Ferroelectric Random-Access Memories," Proceedings of the IEEE, vol. 88, No. 5, pp. 667-689, May 2000.

* cited by examiner

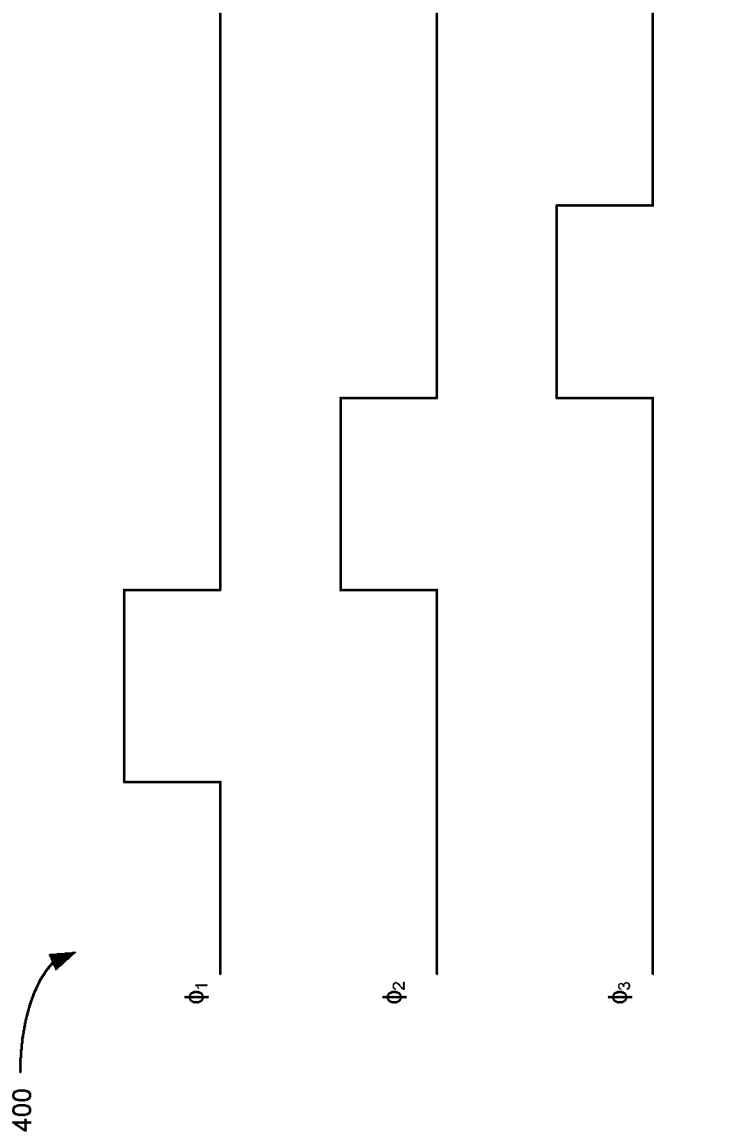

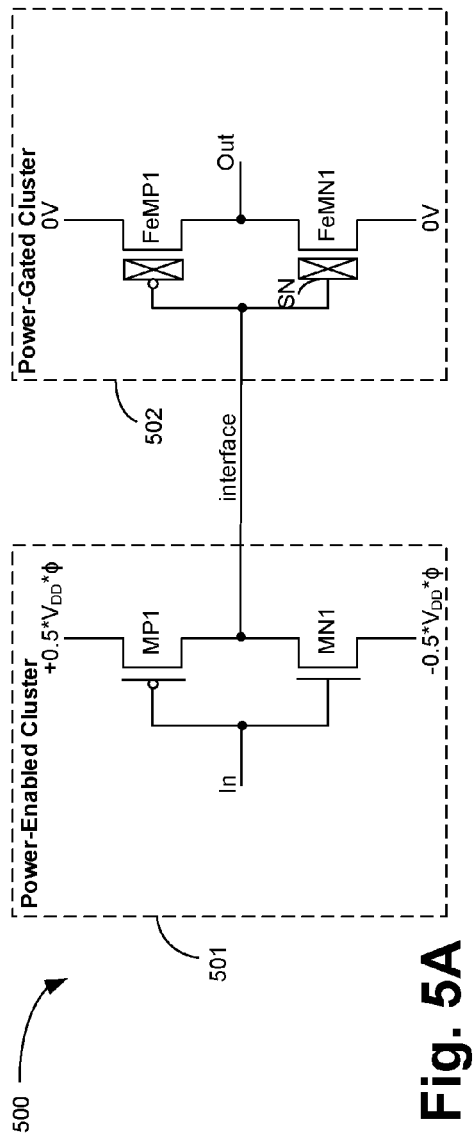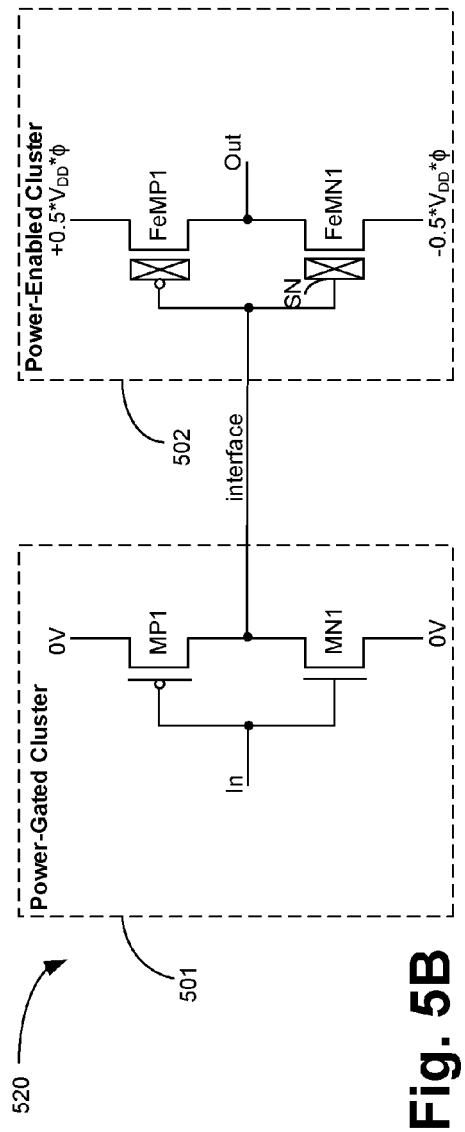
Fig. 5A
Fig. 5B

NON-VOLATILE FERROELECTRIC LOGIC WITH GRANULAR POWER-GATING

BACKGROUND

Power-gating reduces standby leakage power which improves battery lifetime for mobile devices. However, conventional power-gating have limitations. For example, with Metal Oxide Semiconductor Field Effect Transistors (MOSFETs), logic state is stored in always-powered memories or latches to avoid data loss during power-gating. This consumes power and increases complexity. Further, signals crossing from a power-gated domain to another powered domain requires isolation gates (or firewalls) to preserve correct circuit functionality. This incurs power, area, and delay overhead. Additionally, the above limitations are most severe when applying power-gating at more granular levels as would be needed to minimize leakage power. Thus, highly granular power-gating cannot be achieved with current transistor and circuit techniques.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 4 illustrates a plot showing clock phases for generating the switchable source and drain voltages, according to some embodiments of the disclosure.

FIGS. 5A-B illustrate circuits showing power domain crossing using FE state retention devices, according to some embodiments of the disclosure.

DETAILED DESCRIPTION

Figure 1A:
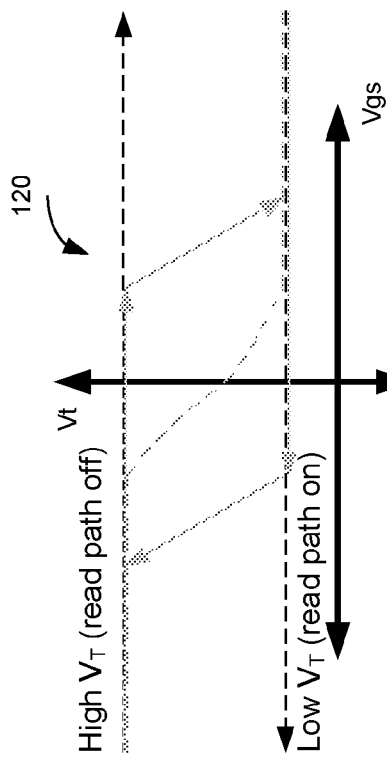
FIGS. 1A-C illustrate plots showing the memory principle of a ferroelectric (FE) transistor, according to some embodiments of the disclosure.

Some embodiments describe ferroelectric field effect transistors (FE-FETs) for low-overhead power-gating state retention and isolation. In some embodiments, the functionality of power-gating state retention and isolation is provided intrinsic to the transistor and logic gate, and without additional circuits. In some embodiments, a binary voltage signaling concept is adapted with a third intermediate voltage below a hysteresis trip-point of a FE-FET gate causing the gate to hold the previous programmed state. This serves to both provide non-volatile memory and isolation for a power-domain crossing, in accordance with some embodiments. With the circuit and device of the various embodiments, localized power-gating signals can power just the logic units needed for the current operation.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical or magnetic connection between the things that are connected, without any intermediary devices. The term "coupled" means either a direct electrical or magnetic connection between the things that are connected or an indirect connection through one or more passive or active intermediary devices. The term "circuit" means one or more passive and/or active components that are arranged to cooperate with one another to provide a desired function. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits and logic blocks described here are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic or ferroelectric FET devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 1C:
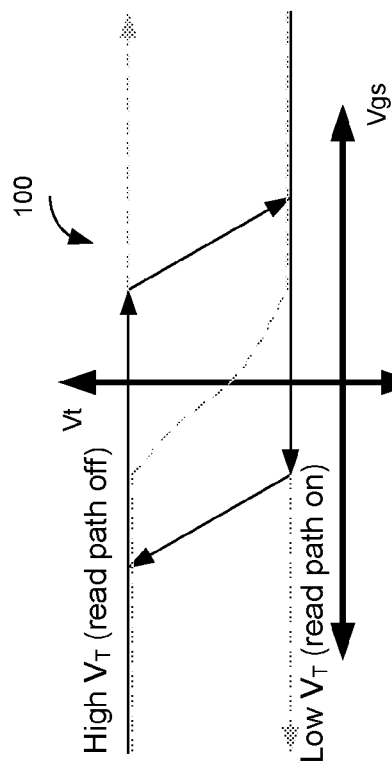
Figure 1B:
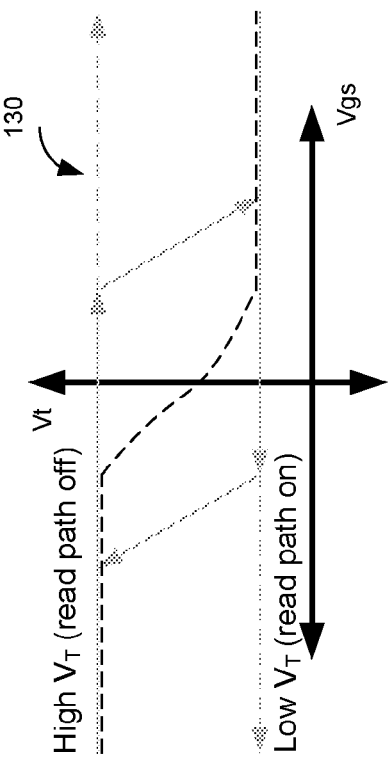
Figure 1D:
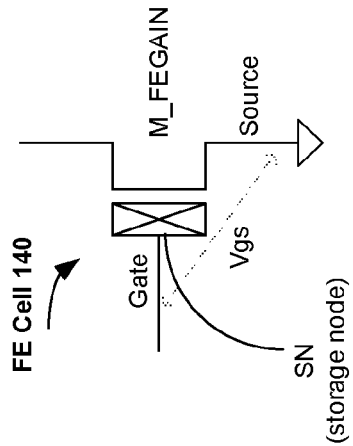
FIG. 1D illustrates a FE transistor to describe FIGS. 1A-C.

FIGS. 1A-C illustrate plots 100, 120, and 130 showing the memory principle of a FE transistor, according to some embodiments of the disclosure. The plots are described with reference to n-type FE-FET M_FEGAIN 140 of FIG. 1D. Here, x-axis is Vgs (i.e., gate to source voltage) of n-type FE-FET M_FEGAIN 140 and y-axis is the effective threshold voltage (Vt) of n-type FE-FET M_FEGAIN 140.

In some embodiments, n-type FE-FET M_FEGAIN 140 (e.g., ferroelectric gain transistor) has a gate terminal coupled to a ferroelectric capacitor (Fe-cap) illustrated as a rectangle with a cross. The ferroelectric capacitor is also referred to as the ferroelectric material or ferroelectric element. Any known suitable ferroelectric material can be used for forming the ferroelectric capacitor. In some embodiments, the ferroelectric capacitor is programmable via a driver driving the gate terminal. In some embodiments, the ferroelectric capacitor is integrated within the gate terminal of n-type FE-FET M_FEGAIN 140.

For example, the gate terminal of n-type FE-FET M_FEGAIN 140 is a ferroelectric gate stack providing a function of a ferroelectric capacitor. In some embodiments, logic state is stored in n-type FE-FET M_FEGAIN 140 as a polarization of a ferroelectric gate stack, allowing for longer retention times (compared to eDRAM) which are insensitive to subthreshold leakage. In some embodiments, the repolarization of the ferroelectric material of n-type FE-FET M_FEGAIN 140 can occur by the dynamic voltage or charge on the storage node SN. Here, the storage node is the node of n-type FE-FET M_FEGAIN 140 having the ferroelectric material. Plot 100 of FIG. 1A shows n-type FE-FET M_FEGAIN 140 exhibiting hysteresis across Vgs with reference to Vt when Vgs is applied for a duration equal to or more than a threshold duration.

Here, the term "threshold duration" generally indicates the minimum time response of ferroelectric polarization to applied electric field. For example, a ferroelectric polarization may be considered to have a delayed response to the applied electric field and could be considered to switch after a threshold duration. The threshold duration is generally proportional to ferroelectric composition, film thickness, and applied field.

The gray dotted line that passes between the two thresholds is the behavior of n-type FE-FET M_FEGAIN 140 over a long period of time (e.g., infinite time response) when the ferroelectric material depolarizes. In some embodiments, when Vgs is applied to n-type FE-FET M_FEGAIN 140 for more than a threshold duration (e.g., 100 ns), the ferromagnetic material is polarized so that it stores a charge according to the applied Vgs. The threshold duration may be a predetermined threshold depending on the ferroelectric material stack and their thicknesses. Various embodiments here are described with the threshold duration as being 100 ns, however, this parameter should not be understood to be limiting as the threshold duration could be designed to be substantially shorter or longer than 100 ns based upon application-specific requirements. In general, longer threshold times can enable lower voltage operation, higher read signals, and longer ferroelectric retention.

As such, depending on the Vgs, a logic 1 or logic 0 state is stored as charge in the ferromagnetic material when the Vgs is applied for more or equal to the threshold duration. This charge can be substantially non-volatile (e.g., it decays over a very long period of time compared to the storage time). In some cases, the non-volatility can be traded for lower voltage operation. For example, potentially the ferroelectric material could be designed to switch faster at a lower voltage but would also depolarize faster and provide shorter duration of non-volatility (e.g., 1 hour of non-volatile storage) before a refresh is needed.

Table 1 summarizes the three-level logic signaling of n-type FE-FET M_FEGAIN 140.

TABLE 1

| Logic State | Corresponding Voltage Level |
|---|---|
| 1 (High) | +0.5 * $V_{DD}$ |
| Hold State | 0 |
| 0 (Low) | −0.5 * $V_{DD}$ |

Logic states 1 and 0 are sufficient to repolarize ferroelectric FET. With sufficient hysteresis window and ferroelectric effects, the Vt (threshold) shift of FE-FET 140 can continue to drive capacitive load even with the intermediate voltage hold-state applied to the gate.

The two threshold levels of Vt are High Vt and Low Vt. These two threshold levels indicate the two programmable storage states—logic 1 and logic 0 states. When n-type FE-FET M_FEGAIN 140 is programmed or the FE material is polarized, a state is stored. For example, a logic state 1 is stored when n-type FE-FET M_FEGAIN 140 is programmed (e.g., by application of Vgs) to high Vt and logic state 0 is stored when n-type FE-FET M_FEGAIN 140 is programmed (e.g., by application of Vgs) to low Vt.

When a state is stored in n-type FE-FET M_FEGAIN 140 by a programmed high Vt, a subsequent intermediate Vgs application to n-type FE-FET M_FEGAIN 140 may cause n-type FE-FET M_FEGAIN 140 to remain off (e.g., because the high Vt is higher than the intermediate Vgs). When a state is stored by a programmed low Vt, a subsequent intermediate Vgs application to transistor M_FEGAIN 140 may cause transistor M_FEGAIN 140 to turn on (e.g., because the low Vt is lower than the normal Vgs).

Here, the term "intermediate Vgs" generally refers to a Vgs value less than the Vgs value used to program a logic-1 state but higher than the Vgs value used to program a logic-0 state. In some embodiments, the absolute value voltage difference between the high logic state and the hold state may not be identical to the voltage difference between the low logic state and the hold state. In effect, the FE element may switch with asymmetric fields. In some embodiments, the hold state may be a non-zero voltage.

Plot 120 of FIG. 1B shows n-type FE-FET M_FEGAIN 140 behavior when a Vgs is applied to n-type FE-FET M_FEGAIN 140 for less than the threshold duration (e.g., less than 100 ns). In this case, the Vgs may not cause the FE material to be programmed or polarized to store a logic state because the duration of Vgs application is not long enough (e.g., not equal or more than the threshold duration). As such, the logic state is stored on the storage node SN by the capacitance on storage node SN including gate capacitance of n-type FE-FET M_FEGAIN 140. The ferroelectric material stacked on the gate terminal of n-type FE-FET M_FEGAIN 140 provides a large enough gate capacitance for temporarily storing a logic state when the FE material is not programmed or polarized.

When a state is stored on the storage node SN (e.g., by the gate capacitance offered by the ferroelectric material of transistor M_FEGAIN 140), transistor M_FEGAIN 140 behaves similar to a normal n-type transistor. In this phase of operation, the threshold voltage of M_FEGAIN has a history (e.g., read current is affected more by the applied SN voltage than by this history effect). In this case (e.g., when Vgs is applied for less than a threshold duration) the state stored by n-type FE-FET M_FEGAIN 140 depends on the state stored on the storage node SN because the ferroelectric material is not polarized.

In some embodiments, n-type FE-FET M_FEGAIN 140 is off when the voltage or charge on the storage node SN is less than Vt. In some embodiments, n-type FE-FET M_FEGAIN 140 is on when voltage or charge on the storage node SN is more than the Vt.

Plot 130 of FIG. 1C shows n-type FE-FET M_FEGAIN 140 behavior after passage of a long duration (i.e., infinite time response). In this case, the ferroelectric material of n-type FE-FET M_FEGAIN 140 depolarizes and so the distinction between high Vt and low Vt blurs. For example, plot 130 shows that the Vt becomes in the middle of high Vt and low Vt which makes it difficult to distinguish between the logic 1 or logic 0 states stored in the ferroelectric material. Data in the n-type FE-FET M_FEGAIN 140 can be lost to depolarization of the FE element which occurs over a long period of time. Additionally, data can be over written by programming n-type FE-FET M_FEGAIN 140 by the application of a Vgs. Applying a Vgs signal of insufficient magnitude or duration can result in the programming of a Vt level intermediate to those defined as Logic-0 or Logic-1.

Figure 2:
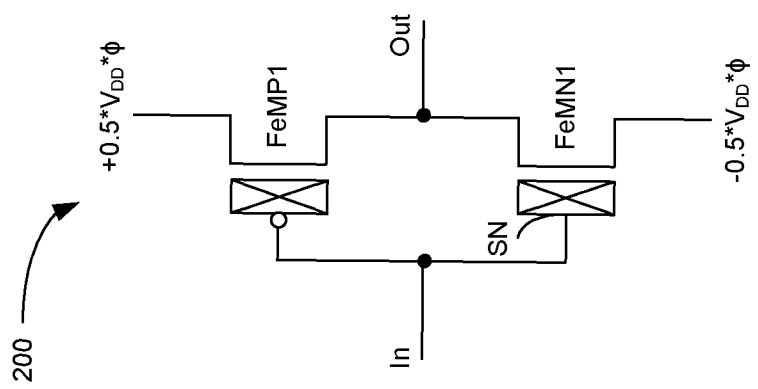
FIG. 2 illustrates a FE inverter with switchable source and drain voltages, according to some embodiments of the disclosure.

FIG. 2 illustrates FE inverter 200 with switching source and drain voltages, according to some embodiments of the disclosure. It is pointed out that those elements of FIG. 2 having the same reference numbers (or names) as the elements of any other figure can operate or function in any manner similar to that described, but are not limited to such.

In some embodiments, FE inverter 200 comprises an n-type FE transistor FeMN1 coupled in series with a p-type FE transistor FeMP1. Here, the storage node (SN) are the FE gates of FeMP1 and FeMN1. In some embodiments, the gate terminals of transistors FeMP1 and FeMN1 are coupled to input "In" while the drain terminals of transistors FeMP1 and FeMN1 are coupled to output "Out." In some embodiments, the source terminal of transistor FeMP1 is coupled to a positive switching supply.

In some embodiments, the positive switchable supply is $+0.5*V_{DD}*\phi$, where $V_{DD}$ is the normal power supply, and $\phi_1$ is the switching waveform. In some embodiments, when $\phi$ is logical high, then the source terminal of FeMP1 is powered by half of $V_{DD}$, and when $\phi$ is logical low then the source terminal of FeMP1 is powered off. In some embodiments, the power mode signal (e.g., sleep signal) controls $\phi$. However, in other embodiments, other variations of the positive switchable supply may be used. For example, the positive switchable supply is $+0.6*V_{DD}*\phi$ instead of $0.5*V_{DD}$.

In some embodiments, the source terminal of transistor FeMN1 is coupled to a negative switchable supply. In some embodiments, the negative switchable supply is $-0.5*V_{DD}*\phi$, where $V_{DD}$ is the normal power supply, and $\phi$ is the switching waveform. However, in other embodiments, other variations of the negative switchable supply may be used. For example, the negative switchable supply is $-0.4*V_{DD}*\phi$ instead of $-0.5*V_{DD}$.

Table 2 illustrates the truth table of FE inverter 200.

TABLE 2

| Power Enabled | Input "In" Voltage Level | Input "In" Logic State | Output 'Out' Voltage Level | Output "Out" Logic State |
|---|---|---|---|---|
| No (e.g., Φ = 0) | $+0.5 * V_{DD}$ | 1 (high) | 0 | Hold |
| No (e.g., Φ = 0) | 0 | Hold | 0 | Hold |
| No (e.g., Φ = 0) | $-0.5 * V_{DD}$ | 0 (low) | 0 | Hold |
| Powered (e.g., Φ = 1) | $+0.5 * V_{DD}$ | 1 (high) | $-0.5 * V_{DD}$ | 0 (low) |
| Powered (e.g., Φ = 1) | 0 | Hold | $+/-0.5 * V_{DD}$ Determined by state of FE elements | 0 (low) or 1 (high) Determined by state of FE elements |
| Powered (e.g., Φ = 1) | $-0.5 * V_{DD}$ | 0 (low) | $+0.5 * V_{DD}$ | 1 (high) |

In some embodiments, FE inverter 200 is used as receiver stage across power supply domains. For example, a signal traversing from a first power domain may be received by FE inverter 200 powered on a second power domain. When the first power domain powers down, the last 0/1 logic state driven by the first power domain is held by the FE gates of FE inverter 200. In some embodiments, the last logic state driven is stored by the FE material when the last 0/1 logic state is driven for a time greater than the threshold duration of the FE material. In some embodiments, a hold output state is caused by removing power from FE inverter 200.

This state is held by the FE gates of FE inverter 200 even when the second power domain powers down. In some embodiments, when the second power domain powers up, FE inverter 200 at the receiver end outputs a state based on the stored state at the FE gates. As such, FE inverter 200 can provide granular power-gating which otherwise would require always-on flip-flops and latches.

Figure 3:
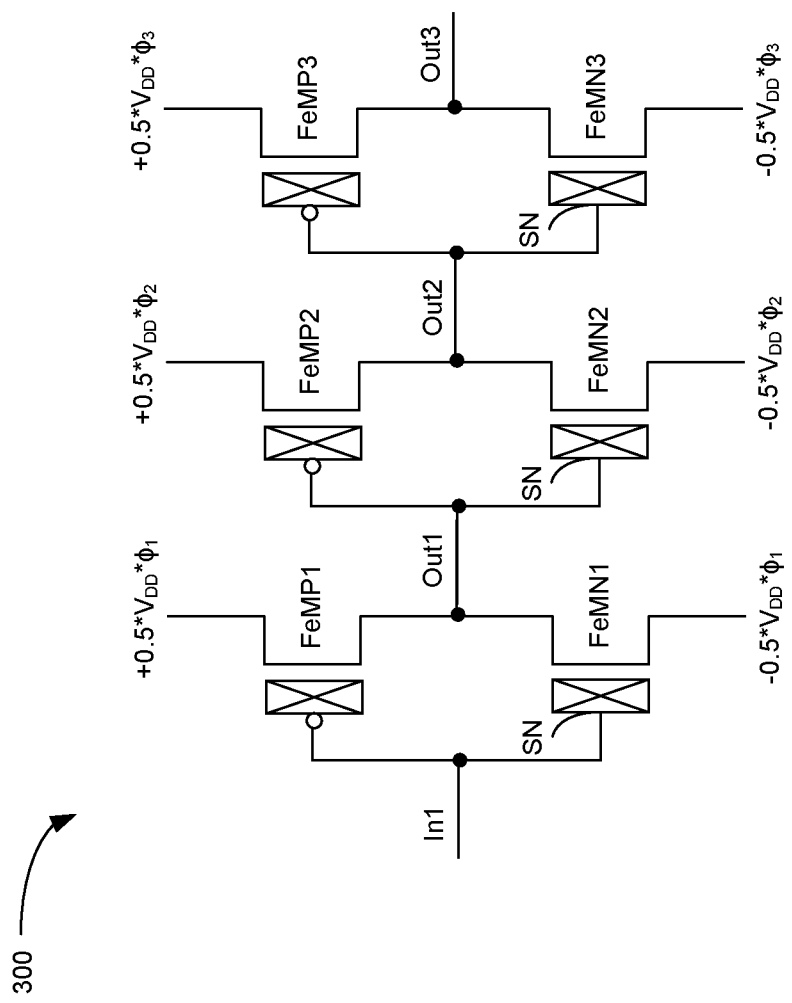
FIG. 3 illustrates a chain of FE inverters with switchable source and drain voltages for fine power-gating, according to some embodiments of the disclosure.

FIG. 3 illustrates chain 300 of FE inverters with switching source and drain voltages for fine power-gating, according to some embodiments of the disclosure. It is pointed out that those elements of FIG. 3 having the same reference numbers (or names) as the elements of any other figure can operate or function in any manner similar to that described, but are not limited to such.

In some embodiments, chain 300 comprises stages of FE logic gates. In this example, three FE inverters (e.g., logic gates) are shown coupled in a series. The first inverter comprises p-type FeMP1 transistor coupled in series with n-type FeMN1 transistor. The second inverter comprises p-type FeMP2 transistor coupled in series with n-type FeMN2 transistor. The third inverter comprises p-type FeMP3 transistor coupled in series with n-type FeMN3 transistor. The first inverter receives input "In" and provides output "Out1" which is used as input by the second inverter. The second inverter outputs "Out2" which is received as input by the third inverter. The third inverter outputs "Out3." Here, labels for signals and nodes are interchangeably used. For example, "Out2" may refer to signal "Out2" or node "Out2" depending on the context of the sentence.

In some embodiments, each FE logic gate may be part of a different power domain. Such a configuration may allow for granular power-gating where several power domains may power on and off without losing data. The FE based logic gates with switchable power supplies at the source nodes of the FE transistors allow for granular power-gating, in accordance with some embodiments. For example, the first inverter is controlled by $\phi_1$, the second inverter is controlled by $\phi_2$, and the third inverter is controlled by $\phi_3$. As such, the first inverter can implement a first power-gate, the second inverter can implement a second power-gate, and the third inverter can implement a third power-gate. The ability to power-gate individual logic gates allows for fine or granular power-gating, in accordance with some embodiments.

FIG. 4 illustrates plot 400 showing clock phases $\phi_{1-3}$ for generating the switching source and drain voltages, according to some embodiments of the disclosure. In this example, each clock phase may represent a power domain active and/or inactive state. For example, when $\phi_1$ is high, the power is on and when $\phi_1$ is low, the power is off. The sequence of turning on/off of clock phases $\phi_{1-3}$ is just an example and can change according to the power saving architecture.

Referring back to FIG. 3, in some embodiments, when a logic gate is powered, it will drive a fan-out based upon the state of the FE input. In some embodiments, the fan-out logic gate does not need to be powered to receive its input signal. For example, when $\phi_1$ is zero (e.g., the first FE inverter powers down), the output "Out1" is not lost but saved in the FE gate material of transistors FeMP2 and FeMN2. In some embodiments, the second inverter uses the saved state at its FE gates to drive "Out2" as if the first inverter was powered up. As such, various logic stages can be divided up into power domains that can be independently controlled without losing data at the interfaces of the power domains. This allows for granular power-gating with minimal logic and area cost, in accordance with some embodiments.

FIGS. 5A-B illustrate circuits 500 and 520, respectively, showing power domain crossing using FE state retention devices, according to some embodiments of the disclosure. It is pointed out that those elements of FIGS. 5A-B having the same reference numbers (or names) as the elements of any other figure can operate or function in any manner similar to that described, but are not limited to such.

Circuit 500 shows two power domains—501 and 502. In some embodiments, the first power domain has a MOSFET based interface driver in the form of a MOSFET inverter having switchable power supplies to its source terminals. Here, the MOSFET inverter comprises transistors MP1 and MN1 coupled together as shown. The output of this inverter is "interface" which is received by another power domain 502. In some embodiments, the interface signals received by power domain 502 are received by FE based logic (e.g., FE inverter). As such, when the drivers lose their power, the state of the interface signal is preserved at the FE gates of power domain 502.

FIG. 5A illustrates the case where first power domain 501 is enabled (e.g., powered) while second power domain 502 is power-gated (e.g., without power). After operations are performed in the first logic cluster of first power domain 501, the output value (i.e., the state on the "interface" node) is written to the isolation gate (e.g., the gates of FeMP1 and FeMN1) of second power domain 502. In some embodiments, the isolation gate may not be powered on.

FIG. 5B illustrates the case where first power domain 501 is power-gated (e.g., powered off) while second power domain 502 is power enabled (e.g., with power). After the first logic cluster of first power domain 501 is power-gated to save power, the logic state of the isolation gate (e.g., the gates of FeMP1 and FeMN1) in the second logic cluster of second power domain 502 is preserved because its input is 0 Volts (i.e., hold signal state). This enables continuous sequence of logic operations with merely active logic regions powered, saving significant power by power-gating large portions of the chip, in accordance with some embodiments.

Figure 6:
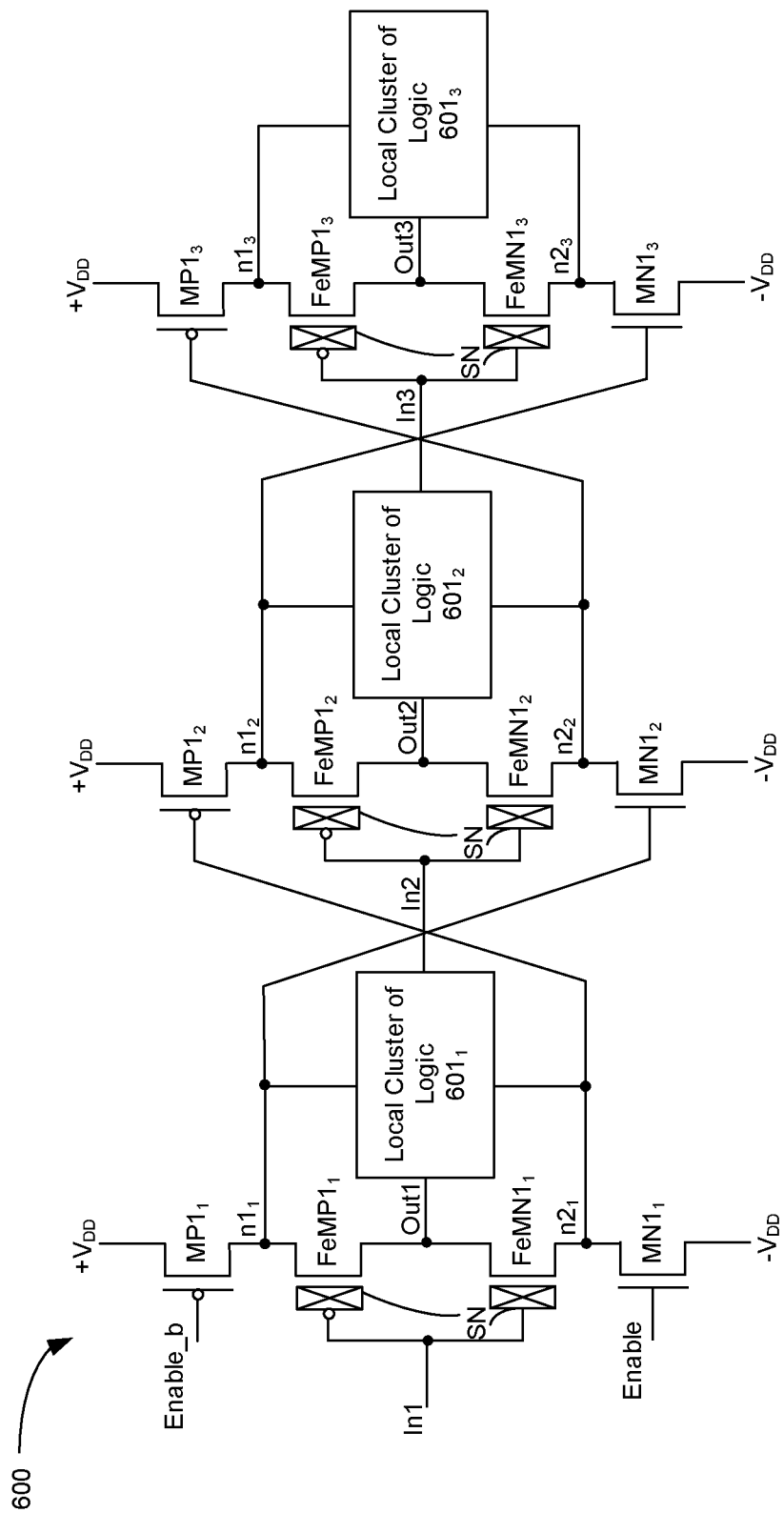
FIG. 6 illustrates a chain of FE logic gates with reduced dynamic power, according to some embodiments of the disclosure.

FIG. 6 illustrates chain 600 of FE logic gates with reduced dynamic power, according to some embodiments of the disclosure. It is pointed out that those elements of FIG. 6 having the same reference numbers (or names) as the elements of any other figure can operate or function in any manner similar to that described, but are not limited to such.

The embodiment of FIG. 6 provides a scheme in which ferroelectric logic gates are used in a manner that reduces dynamic power overhead compared to the embodiment of FIG. 3. In some embodiments, Fe-FETs serves as isolation or firewall gates with low area and power overhead. In some embodiments, power-gating enable signals are provided which are highly granular and automatically computed locally to the related logic.

In some embodiments, chain 600 comprises a FE-MOS logic gate in a supply-gated inverter topology. In this example, three FE-MOS logic gates are shown. The first FE-MOS logic gate comprises p-type MOS transistor $MP1_1$, n-type MOS transistor $MN1_1$, n-type FE transistor $FeMN1_1$, and p-type FE transistor $FeMP1_1$ coupled together as shown. In some embodiments, the first FE-MOS logic gate is controlled by power-gating enable signals Enable and Enable_b, where Enable_b is an inverse of Enable signal (or complementary of the Enable signal). Instead of providing switching power supplies to the source terminals of $FeMN1_1$ and $FeMP1_1$, here, MOS transistors $MP1_1$ and $MN1_1$ emulate the power switching behavior with lower dynamic power. For example, powering a logic cluster causes the power enable signals associated with the output to assert and turn on other logic clusters driven by the output.

Transistors $FeMN1_1$ and $FeMP1_1$ receive input signal "In1" and generate an output signal "Out1" which is received by a Local Cluster of Logic $601_1$. In some embodiments, Local Cluster of Logic $601_1$ can perform any function and may be implemented with any kind of transistors (e.g., MOSFETs, FeFETs, etc.). In some embodiments, Local Cluster of Logic $601_1$ is powered by supplies provided by nodes $n1_1$ and $n2_1$. In some embodiments, when the Enable signal is logic high, node $n2_1$ provides $-V_{DD}$ to Local Cluster of Logic $601_1$ while node $n1_1$ provides $+V_{DD}$ to Local Cluster of Logic $601_1$. In some embodiments, Local Cluster of Logic $601_1$ generates one or more outputs. In this example, the output that needs to have its state preserved during power down mode is provided as In2 to the next Fe-MOS logic gate.

In some embodiments, the second FE-MOS logic gate comprises p-type MOS transistor $MP1_2$, n-type MOS transistor $MN1_2$, n-type FE transistor $FeMN1_2$, and p-type FE transistor $FeMP1_2$ coupled together as shown. In some embodiments, the second FE-MOS logic gate receives derived versions of Enable and Enable_b signals. In some embodiments, the second FE-MOS logic gate receives Enable and Enable_b signals directly. In some embodiments, transistor $MP1_2$ is controlled by $n2_1$ while transistor $MN1_2$ is controlled by $n1_1$. In some embodiments, the derived power gate signals (e.g. $n1_1$) do not discharge to the source voltage (e.g., VSS). In some embodiments, the voltage on $n1_1$ node goes low enough to reduce leakage while state is held by FE-MOS to prevent rush though currents. In some embodiments, the voltages on the n1, n2, and n3 nodes settle when the leakage is very low relative to dynamic power (e.g., with time the leakage goes even lower).

In some embodiments, Local Cluster of Logic $601_2$ generates one or more outputs. In this example, the output that needs to have its state preserved during power down mode is provided as In3 to the next Fe-MOS logic gate. Transistors $FeMN1_2$ and $FeMP1_2$ receive input signal "In2" and generate an output signal "Out2" which is received by a Local Cluster of Logic $601_2$. In some embodiments, Local Cluster of Logic $601_2$ can perform any function and may be implemented with any kind of transistors (e.g., MOSFETs, FeFETs, etc.). In some embodiments, Local Cluster of Logic $601_2$ is powered by supplies provided by nodes $n1_2$ and $n2_2$.

In some embodiments, when $n1_1$ is greater than $-V_{DD}+V_{TN}$, transistor $MN1_2$ provides $-V_{DD}$ to $n2_2$ which provides that supply to Local Cluster of Logic $601_2$. In some embodiments, when $n2_1$ is less than $V_{DD}-V_{TP}$, transistor $MP1_2$ provides $V_{DD}$ to $n1_2$ which provides that supply to Local Cluster of Logic $601_2$ (where $V_{TN}$ is the threshold voltage of an n-type transistor and $V_{TP}$ is the threshold voltage of a p-type transistor).

In some embodiments, the third FE-MOS logic gate comprises p-type MOS transistor $MP1_3$, n-type MOS transistor $MN1_3$, n-type FE transistor $FeMN1_3$, and p-type FE transistor $FeMP1_3$ coupled together as shown. In some embodiments, the third FE-MOS logic gate receives derived versions of Enable and Enable_b signals. In some embodiments, transistor $MP1_3$ is controlled by $n2_2$ while transistor $MN1_3$ is controlled by $n1_2$.

In some embodiments, transistors $FeMN1_3$ and $FeMP1_3$ receive input signal "In3" and generate an output signal "Out3" which is received by a Local Cluster of Logic $601_3$. In some embodiments, Local Cluster of Logic $601_3$ can perform any function and may be implemented with any kind of transistors (e.g., MOSFETs, FeFETs, etc.). In some embodiments, Local Cluster of Logic $601_3$ is powered by supplies provided by nodes $n1_3$ and $n2_3$.

In some embodiments, when $n1_2$ is greater than $-V_{DD}+V_{TN}$, transistor $MN1_3$ provides $-V_{DD}$ to $n2_3$ which provides that supply to Local Cluster of Logic $601_3$. In some embodiments, when voltage on node $n2_2$ is less than $V_{DD}-V_{TP}$, transistor $MP1_3$ provides $V_{DD}$ to node $n1_3$ which provides that supply to Local Cluster of Logic $601_3$.

In some embodiments, the Enable signals propagate along the logic cone from each powered primary input to the output. For a changing output, merely a subset of the input cone that changes needs to be powered, in accordance with some embodiments. As such, dynamic and leakage energy is reduced. In some embodiments, as the switching of logic gates is highly correlated, single Fe-FETs and power-gates can be shared within small clusters of logic. The logic in the clusters may be implemented with either Fe-FET or conventional MOSFETs, in accordance with some embodiments. In some embodiments, the size of the cluster may be smaller than in a MOSFET only technology without excessive loss in efficiency due to the power-gating overhead.

Figure 7:
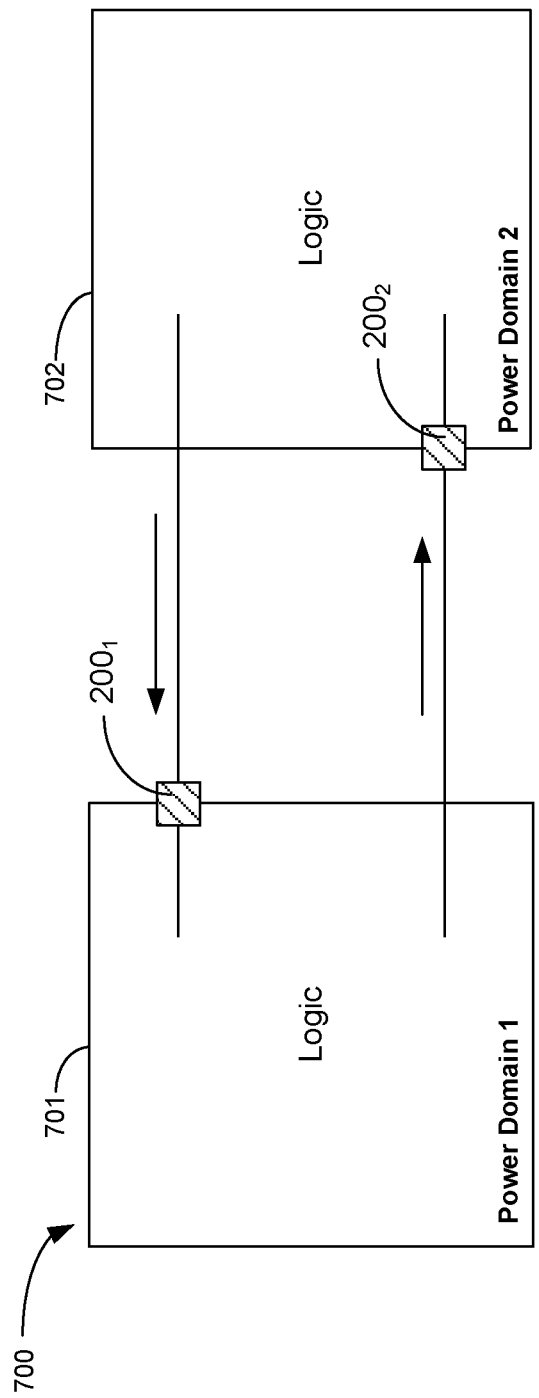
FIG. 7 illustrates part of an integrated circuit (IC) having FE devices for coarse power-gating, according to some embodiments of the disclosure.

FIG. 7 illustrates part of an integrated circuit 700 having FE devices for coarse power-gating, according to some embodiments of the disclosure. It is pointed out that those elements of FIG. 7 having the same reference numbers (or names) as the elements of any other figure can operate or function in any manner similar to that described, but are not limited to such.

In some embodiments, integrated circuit 700 comprises power domain 1 701 and power domain 2 702. In some embodiments, at the receiving ports of the power domains, Fe-FET based logic gates are used. As such, power-gating between large power domains is possible with fewer transistors and simple logic. Here, Fe-FET based logic gates $200_1$ and $200_2$ are placed at the interfaces of the receiving signals, where each of the Fe-FET based logic gate is like logic gate 200 described with reference to FIG. 2.

The embodiments of FIG. 7 illustrate the application of a FE device for coarse power-gating as in common in convention digital integrated circuits. Here, the term "coarse power-gating" generally refers to power-gating between large logic blocks (e.g., cache, execution unit, input-output interface circuits, etc.) while the term "fine or granular power-gating" generally refers to power-gating between small circuits and small logic clusters (e.g., circuits within an execution unit). Here, firewall or isolation logic gates (e.g., Fe-FET based logic gates $200_1$ and $200_2$) are placed on input signals as they cross power domains.

In some embodiments, logic stages can be clocked on different power clock phases to enable low overhead pipelining. For example, data can be latched by the FE elements and synchronized by the power clocks. This type of pipelining can increase the throughput of a logic block as the logic that is separated by the ferroelectric latch may operate in parallel and be clocked at a higher rate than may otherwise be possible. Conventional pipelined CMOS logic requires additional latches and clock signals. Here, however, the ferroelectric elements and clocked power-enable signals enable logic pipelining without additional overhead. In some embodiments, the ferroelectric gate does not necessarily need to be fully non-volatile (e.g., long retention) for all applications. For example, the retention time can be short for embodiments with frequency switching of power-gating state. In some embodiments, the retention time need merely be longer than switching period of the power-gating state as the logic will refresh when the circuit is powered.

Figure 8:
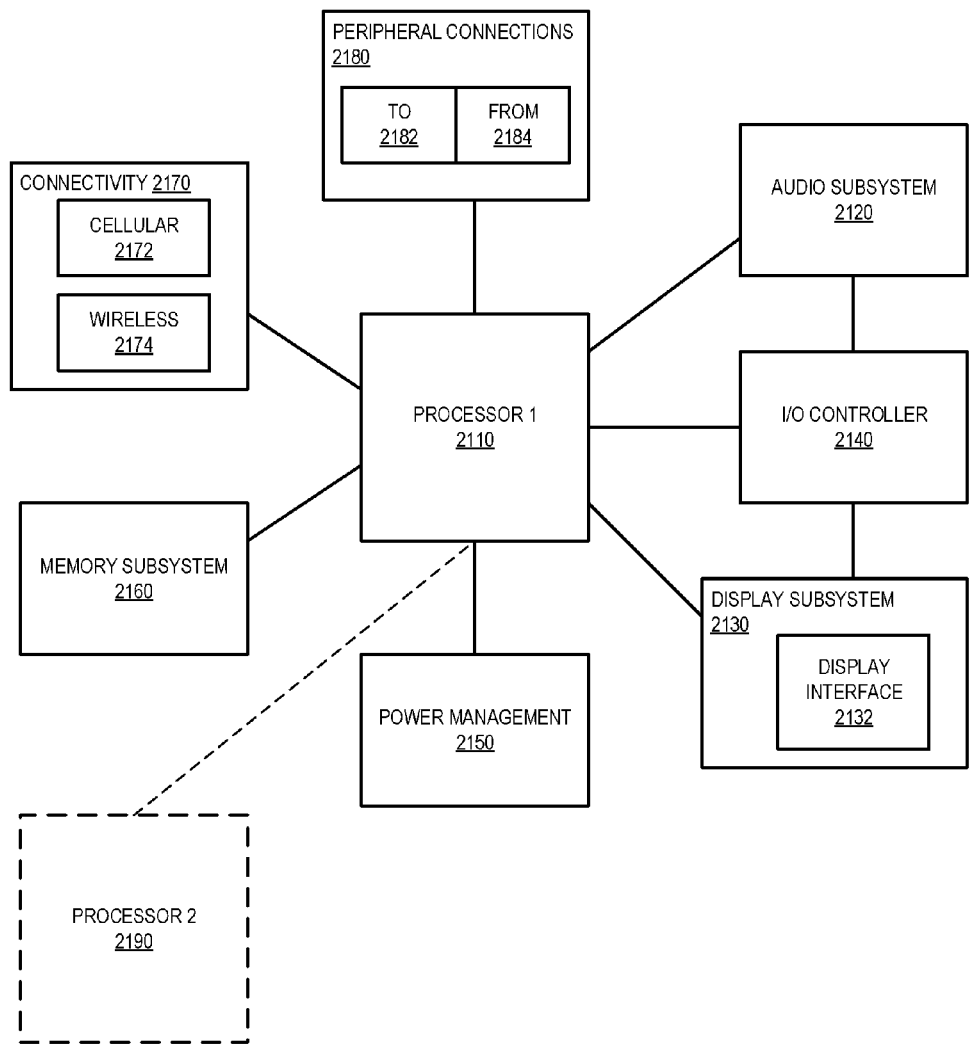
FIG. 8 illustrates a smart device or a computer system or a SoC (System-on-Chip) having FE devices for power-gating, according to some embodiments.

FIG. 8 illustrates a smart device or a computer system or a SoC (System-on-Chip) having FE devices for power-gating, according to some embodiments. It is pointed out that those elements of FIG. 8 having the same reference numbers (or names) as the elements of any other figure can operate or function in any manner similar to that described, but are not limited to such.

FIG. 8 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with non-volatile ferroelectric logic with granular power-gating, according to some embodiments discussed. Other blocks of the computing device 2100 may also include the non-volatile ferroelectric logic with granular power-gating of some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display M.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first power domain having a first inverter to be powered by a first switchable positive supply and a first switchable negative supply; and a second power domain having a second inverter including p-type and n-type ferroelectric field effect transistors (FE-FETs), the second inverter having an input coupled to an output of the first inverter. In some embodiments, the second inverter is to hold a logic state at gate terminals of the p-type and n-type FE-FETs when the first power domain is powered down by switching off the first switchable positive and negative supplies. In some embodiments, the second inverter is to hold a logic state at gate terminals of the p-type and n-type FE-FETs when the first switchable positive and switchable supplies are to be set to zero supplies, respectively.

In some embodiments, the first inverter includes p-type and n-type MOSFETs coupled to the p-type and n-type FE-FETs, respectively. In some embodiments, the first switchable positive power supply is to switch between a positive supply and zero supply. In some embodiments, the first switchable negative power supply is to switch between a negative supply and zero supply. In some embodiments, the second inverter is to be powered by a second switchable positive supply and a second switchable negative supply such that second switchable positive supply is to be provided to a p-type FE-FET of the second inverter, and wherein the second switchable negative supply is to be provided to an n-type FE-FET of the second inverter. In some embodiments, the first power domain is separate from the second power domain.

In another example, an apparatus is provided which comprises: a first p-type Metal Oxide Semiconductor Field Effect Transistor (MOSFET) to be coupled to a positive supply and controllable by a control signal; a first p-type Ferroelectric Field Effect Transistor (FE-FET) coupled in series with the first p-type MOSFET, the first p-type FE-FET coupled to a first input node; a first n-type FE-FET coupled in series with the first p-type FE-FET, the first p-type FE-FET coupled to the first input node, wherein the first p-type and n-type FE-FETs are coupled to a first output node; and a first n-type MOSFET coupled in series with the first n-type FE-FET, the first n-type MOSFET to be coupled to a negative supply and controllable by a complementary of the control signal.

In some embodiments, the apparatus comprises a cluster of logic which is coupled to the first output node, source terminal of the first p-type FE-FET, and source terminal of the first n-type FE-FET, wherein the cluster of logic having a second output node. In some embodiments, the apparatus comprises a second p-type MOSFET to be coupled to a positive supply and the source terminal of the first n-type MOSFET. In some embodiments, the apparatus comprises a second p-type FE-FET coupled in series with the first p-type MOSFET, the first p-type FE-FET coupled to the second output node.

In some embodiments, the apparatus comprises a second n-type FE-FET coupled in series with the first p-type FE-FET, the first p-type FE-FET coupled to the second output node, wherein the first p-type and n-type FE-FETs are coupled to a third output node. In some embodiments, the apparatus comprises a second n-type MOSFET coupled in series with the first n-type FE-FET, the first n-type MOSFET to be coupled to a negative supply and to the source terminal of the first p-type FE-FET. In some embodiments, the second n-type and p-type FE-FETs are to hold a logic state of the second output node when the cluster of logic is to be powered down.

In another example, a system is provided which comprises: a memory; a processor coupled to the memory, the processor including: a first power domain having a first inverter to be powered by a first switchable positive supply and a first switchable negative supply; and a second power domain having a second inverter including p-type and n-type ferroelectric field effect transistors (FE-FETs), the second inverter having an input coupled to an output of the first inverter; and a wireless interface for allowing the processor to communicate with another device. In some embodiments, The system of claim 16, wherein the second inverter is to hold a logic state at gate terminals of the p-type and n-type FE-FETs when the first power domain is to be powered down. In some embodiments, the second inverter is to hold a logic state at gate terminals of the p-type and n-type FE-FETs when the first switching positive and negative supplies are to be set to zero supplies, respectively. In some embodiments, the first inverter includes p-type and n-type MOSFETs coupled to the p-type and n-type FE-FETs, respectively. In some embodiments, the first switching positive power supply is to switch between a positive supply and zero supply.

In another example, a system is provided which comprises: a memory; a processor coupled to the memory, the processor including: a first p-type Metal Oxide Semiconductor Field Effect Transistor (MOSFET) to be coupled to a positive supply and controllable by a control signal; a first p-type Ferroelectric Field Effect Transistor (FE-FET) coupled in series with the first p-type MOSFET, the first p-type FE-FET coupled to a first input node; a first n-type FE-FET coupled in series with the first p-type FE-FET, the first p-type FE-FET coupled to the first input node, wherein the first p-type and n-type FE-FETs are coupled to a first output node; and a first n-type MOSFET coupled in series with the first n-type FE-FET, the first n-type MOSFET to be coupled to a negative supply and controllable by a complementary of the control signal; and a wireless interface for allowing the processor to communicate with another device.

In some embodiments, the processor comprises a cluster of logic which is coupled to the first output node, source terminal of the first p-type FE-FET, and source terminal of the first n-type FE-FET, wherein the cluster of logic having a second output node. In some embodiments, the processor comprises a second p-type MOSFET to be coupled to a positive supply and the source terminal of the first n-type MOSFET. In some embodiments, the processor comprises a second p-type FE-FET coupled in series with the first p-type MOSFET, the first p-type FE-FET coupled to the second output node. In some embodiments, the processor comprises a second n-type FE-FET coupled in series with the first p-type FE-FET, the first p-type FE-FET coupled to the second output node, wherein the first p-type and n-type FE-FETs are coupled to a third output node.

In some embodiments, the processor comprises a second n-type MOSFET coupled in series with the first n-type FE-FET, the first n-type MOSFET to be coupled to a negative supply and to the source terminal of the first p-type FE-FET. In some embodiments, the second n-type and p-type FE-FETs are to hold a logic state of the second output node when the cluster of logic is to be powered down.

In another example, a method is provided which comprises: coupling a first p-type Metal Oxide Semiconductor Field Effect Transistor (MOSFET) to a positive supply, wherein the first p-type MOSFET is controllable by a control signal; coupling a first p-type Ferroelectric Field Effect Transistor (FE-FET) in series with the first p-type MOSFET; coupling the first p-type FE-FET to a first input node; coupling a first n-type FE-FET in series with the first p-type FE-FET; coupling the first p-type FE-FET to the first input node; coupling the first p-type and n-type FE-FETs to a first output node; coupling a first n-type MOSFET in series with the first n-type FE-FET; and coupling the first n-type MOSFET to a negative supply, wherein the first n-type MOSFET is controllable by a complementary of the control signal.

In another example, an apparatus is provided which comprises: means for coupling a first p-type Metal Oxide Semiconductor Field Effect Transistor (MOSFET) to a positive supply, wherein the first p-type MOSFET is controllable by a control signal; means for coupling a first p-type Ferroelectric Field Effect Transistor (FE-FET) in series with the first p-type MOSFET; means for coupling the first p-type FE-FET to a first input node; means for coupling a first n-type FE-FET in series with the first p-type FE-FET; means for coupling the first p-type FE-FET to the first input node; means for coupling the first p-type and n-type FE-FETs to a first output node; means for coupling a first n-type MOSFET in series with the first n-type FE-FET; and means for coupling the first n-type MOSFET to a negative supply, wherein the first n-type MOSFET is controllable by a complementary of the control signal.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:
1. An apparatus comprising:
   a first power domain having a first inverter to be powered by a first switchable positive supply and a first switchable negative supply; and
   a second power domain having a second inverter including p-type and n-type ferroelectric field effect transistors (FE-FETs), the second inverter having an input coupled to an output of the first inverter, wherein the first power domain is separate from the second power domain.

2. The apparatus of claim 1, wherein the second inverter is to hold a logic state at gate terminals of the p-type and n-type FE-FETs when the first power domain is powered down by switching off the first switchable positive and negative supplies.

3. The apparatus of claim 1, wherein the second inverter is to hold a logic state at gate terminals of the p-type and n-type FE-FETs when the first switchable positive and switchable supplies are to be set to zero supplies, respectively.

4. The apparatus of claim 1, wherein the first inverter includes p-type and n-type MOSFETs coupled to the p-type and n-type FE-FETs, respectively.

5. The apparatus of claim 1, wherein the first switchable positive power supply is to switch between a positive supply and zero supply.

6. The apparatus of claim 1, wherein the first switchable negative power supply is to switch between a negative supply and zero supply.

7. The apparatus of claim 1, wherein the second inverter is to be powered by a second switchable positive supply and a second switchable negative supply such that second switchable positive supply is to be provided to a p-type FE-FET of the second inverter, and wherein the second switchable negative supply is to be provided to an n-type FE-FET of the second inverter.

8. The apparatus of claim 1, wherein the first power domain is separate from the second power domain.

* * * * *